United States Patent
Forster

[19]

[11] Patent Number: 6,046,668
[45] Date of Patent: Apr. 4, 2000

[54] INTERROGATOR CIRCUIT ARRANGEMENT

[75] Inventor: Ian James Forster, Chelmsford, United Kingdom

[73] Assignee: GEC-Marconi Communications. Ltd, Middlesex, United Kingdom

[21] Appl. No.: 08/908,437

[22] Filed: Aug. 7, 1997

[30] Foreign Application Priority Data

Aug. 8, 1996 [GB] United Kingdom .................... 9616610

[51] Int. Cl.[7] ..................................................... H04Q 1/00
[52] U.S. Cl. ...................................... 340/10.4; 340/572.2
[58] Field of Search ........................ 340/825.54, 825.69, 340/825.71, 825.16, 505, 572.2, 572.5; 342/175, 42; 367/2, 6; 455/333, 318, 327, 326; 331/58, 65, 108 R, 117 FE, 187; 1/1

[56] References Cited

U.S. PATENT DOCUMENTS

| | | | |
|---|---|---|---|
| 4,219,779 | 8/1980 | Shinkawa et al. | 455/333 X |
| 4,334,324 | 6/1982 | Hoover | 455/333 |
| 4,605,909 | 8/1986 | Tsironis | 331/117 FE X |
| 4,658,440 | 4/1987 | Pavio et al. | 331/117 FE X |
| 5,250,944 | 10/1993 | Urbas et al. | 340/825.54 X |
| 5,355,137 | 10/1994 | Schurmann | 342/42 |
| 5,465,418 | 11/1995 | Zhou et al. | 455/333 X |

FOREIGN PATENT DOCUMENTS

| | | |
|---|---|---|
| 3332328 | 3/1985 | Germany . |
| 4127892 | 2/1993 | Germany . |
| 1178693 | 1/1970 | United Kingdom . |
| 2284323 | 11/1993 | United Kingdom . |
| 2280558 | 2/1995 | United Kingdom . |

*Primary Examiner*—Brian Zimmerman
*Attorney, Agent, or Firm*—Donald C. Casey, Esq.

[57] ABSTRACT

An interrogator circuit (2) for use with a semi-passive transponder (30) of a type which reflectively modulates an incoming signal (28) is described. The circuit (2) comprises an antenna (4), a transistor (8), a matching network (6) connecting to the antenna (4) to an input of the transistor and means (12, 14) for operating the transistor such that it self-oscillates and radiates power (28) from the antenna (4) and simultaneously acts as a self-oscillating mixer to produce an output (40) which is representative of the modulation of a signal 32 received at the antenna. For an efficient conversion gain the reflection coefficient of the antenna (4) is configured to be low when the circuit is in a stable self-oscillating condition.

13 Claims, 1 Drawing Sheet

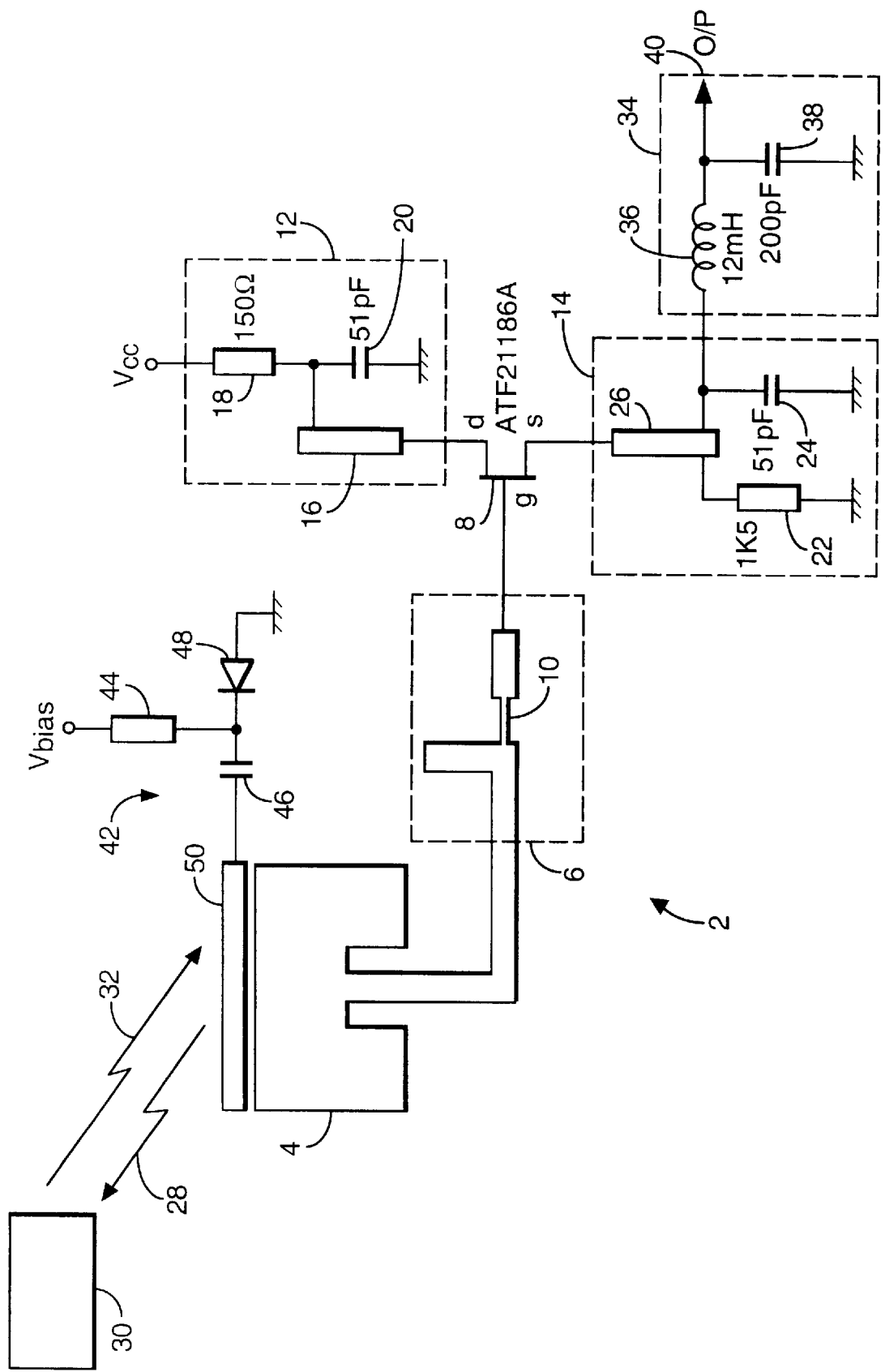

INTERROGATOR CIRCUIT ARRANGEMENT

BACKGROUND OF THE INVENTION

1. Field of the Invention

This invention relates to an interrogator circuit for use in a tagging system which has tags including a semi-passive or reflective modulating transponder.

2. Description of the Related Art

The application of tagging systems using transponder circuits is becoming increasingly widespread. Tagging systems generally comprise a number of integrator circuits which are connected to a control centre by means of a communications network and a number of tags with which the interrogator can communicate typically by means of radio links. Generally an interrogator circuit is at a fixed location whilst the tags are fitted to objects which are mobile.

One example of a tagging system is a road tolling system in which vehicles are fitted with a transponder (tag) which can be interrogated by interrogating circuits which are situated at toll collection points around the road network. Communication between the vehicle and the interrogating circuit provides the requisite tolling information for charging the road user. The applications for tagging systems are virtually limitless, for example in the field of telematics, that is, the communication between an infrastructure and vehicles, it has been proposed to use such tags in the translation of road signs, for routing information and bus priority schemes to name but a few. Other applications include logistics, for example keeping tack of the movements of goods such as food between a warehouse and a number of retail outlets. In all of these applications the transponder circuit which typically operates at microwave frequencies, needs to be inexpensive and have a long opening life. To meet the former require the circuitry to be simple, whilst the latter generally requires the circuit to have low power consumption and be capable of operating from a battery source.

Transponder circuits for tags may be "active", that is it includes its own radio transmitter and is able to transmit without the assistance of the interrogator circuit, purely "passive" that is they can be read by an interrogator but cannot themselves talk to the interrogator circuit, or be what is termed semi-passive. Semi-passive transponders can detect data transmitted to them from the interrogator and transmit information to the interrogator by reflecting and modulating the signal received from the interrogator. As such, semi-passive transponders do not include an active transmitter and rely solely on the interrogator to provide the communication medium. Such transponders are also often referred to as reflective modulator type transponders. Since such transponders require minimal radio frequency circuitry the tags are compact and have very low power consumption making them ideally suited to many tagging applications. The present invention relates to an interrogator circuit which is suitable for use with semi-passive transponders. This requires the interrogator circuit to be cable of transmitting a signal and simultaneously demodulating a received signal.

The suitability of tagging systems to a given application is at present largely limited by the cost of the interrogator circuit and tag transponder. Whilst much time and effort has been expended in developing efficient, inexpensive semi-active tag transponders the interrogator circuits remain relatively complex and expensive. Usually a separate receiver and transmitter circuit are provided which may or may not use a common antenna. Often these circuits include double balanced mixers which are configured as an image reject front end and have I and Q baseband receivers. Whilst such interrogator circuits are found to work very effectively in terms of range and robustness they have an associated problem that their production cost is high, typically of the order of a few hundred pounds. A number of applications exist for a much lower cost interrogator circuit which is capable of operating at a moderate range, typically ten metres or so. In addition to the need for an inexpensive interrogator, a whole new range of applications arises if the interrogator circuit could be operated from a battery source. At present, whilst the tags have very low power consumption, the interrogator, which is typically located at a fixed location and has the benefit of a mains power supply available, has a relatively high power consumption. A need therefore exists for an interrogator circuit for use with semi-passive transponders which has very low power consumption and can be effectively operated from a battery supply over a long period of time.

SUMMARY OF THE INVENTION

According to a first aspect of the invention an interrogator circuit for use with a semi-passive transponder comprises: a transistor configured in operation to self oscillate and simultaneously act as a self oscillating mixer to detect modulation of a signal applied to an input of the transistor. Since the inventions only a single transistor the circuit is inexpensive, has very low power consumption and can be operated from a battery supply.

According to a further aspect of the invention there is provided an irrigator circuit for use with a transponder of a type which reflectively modulates a received signal, the interrogator circuit comprising: an antenna, a transistor, a matching network connecting the antenna to an input of the transistor and means for operating the transistor such that, it self-oscillates and radiates a signal from the antenna and simultaneously act as a self-oscillating mixer to produce an output which is representative of the modulation of a signal reflectivity modulated by the transponder.

In a particularly preferred embodiment the circuit is arranged such that the frequency of oscillation of the transistor is determined by the resonant frequency of the antenna. As the oscillation frequency is determined by the resonant frequency of the antenna this eliminates the need for additional frequency stabilization elements such as a dielectric resonator, thereby simplifying the circuit greatly. Furthermore since the oscillation frequency is denied by the resonant frequency of the antenna this ensures the conversions gain of the self oscillating mixer is high. This is because at resonance the return loss of the antenna will be low which ensures the reflection gain of the transistor remains high is a stable oscillatory condition.

Preferably the antenna is well matched to the transistor. In a preferred arrangement the interrogator circuit further comprises means for setting the resonant frequency of the antenna thereby enabling the frequency of operation of the circuit to be accurately set Where it is required to operate the circuit at microwave frequencies the transistor conveniently comprises a field effect transistor, the antenna comprises a patch antenna and the matching circuit comprises a micro strip line.

Advantageously the interrogator circuit further comprises means for modulating the power radiated from the antenna enabling the circuit to communicate information to a semi-passive transponder. Preferably modulation of the signal is detected using a tuned circuit connected to the output of the transistor.

BRIEF DESCRIPTION OF THE DRAWINGS

The drawing is a schematic of an interrogator circuit of this invention.

DESCRIPTION OF A PREFERRED EMBODIMENT

Referring to the drawing, there is shown an interrogator circuit 2 in accordance with the invention which comprises a patch antenna 4 configured for operation at 2.45 GHz. The antenna 4 is connected by a means of an impedance matching network 6 to the gate g of a field affect transistor (FET) 8. In the embodiment illustrated the FET 8 is a Gallium Arsenide FET ATF 21186A. For operation at 2.45 GHz the matching network 6 comprises a microstrip line arrangement 10 which matches the impedance of the FET 8 to that of the antenna 4 thereby ensuring the reflection coefficient, or return loss, of the antenna as seen from the FET 8 is low, typically of the order of −20 dB.

Respective bias and matching networks 12, 14 and provided at the drain d and source s of the FET 8. The bias and matching networks 12, 14 set the appropriate dc operating condition, bias condition, for the FET 8 and ensure that the FET 8 operates as a negative resistance; that is a signal applied to the gate g is reflected with increased magnitude. Conveniently, the bias and matching network 12 comprises a microstrip line 16, a resistor 18 and capacitor 20 as illustrated in the drawing. The bias and matching network 14 at the source s comprises a resistor 22, a capacitor 24 and microstrip line 26. It will be appreciated that the use of a particular bias and matching network is not essential to the invention and will depend on a given application, in particular, the required operating frequency which will largely determine the type of transistor/antenna required.

The FET 8 is configured by means of the bias and matching networks 12, 14 to ensure that when the circuit is initially powered-up, that is, the circuit is in a small signal condition, the reflection gain of the FET 8 is greater than the refection coefficient (return loss) of the antenna 4. As a consequence when the circuit is powered up any signal which is present at the gate will be reflected with increased magnitude towards the antenna 4. Since the reflection coefficient of the antenna 4 is lower than the reflection gain of the FET 8 the majority of the signal will be radiated by the antenna 4. However a very small proportion of the signal will be re-reflected by the antenna 4 back towards the gate g, in the example 1 dB. This proportion will be re-reflected and amplified by the FET 8 and a small portion subsequently reflected by the antenna 4. This process will continue such that the signal magnitude will increase until the circuit 2 reaches a stable oscillatory condition. In such a condition the reflection gain of the FET 8 becomes compressed and will equal the reflection coefficient (return loss) of the antenna 4. In this stable condition the circuit self-oscillates and radiates a continuous wave (cw) signal 28 at, or near to, 2.45 GHz The difference between the reflection gain and return loss in a small signal condition determines how quickly the circuit reaches a stable oscillatory condition.

If a reflective modulator type transponder (semi passive transponder) tag 30 is placed in the vicinity of the interrogator circuit 2 it will modulate and reflect the signal 28 to produce a modulated signal 32. The tag 30 modulates the continuous wave 28 incident upon it with information by generating a double sideband at, for example, a 100 kHz baseband. The modulated signal 32 is received by the antenna 4. The received 100 kHz sidebands are mixed with the transmitted signal 28, causing a baseband current to flow in the sourse, which drives a series tuned circuit 34. The tuned circuit 34 comprises an inductor 36 and a capacitor 38. The selection of these components 36, 38 is used to detect a signal to produce a demodulated sign at an output 40 of the required baseband frequency. In the example the circuit 34 is tuned for operation at 100 kHz It will be appreciated that the interrogator circuit 2 operates to self-oscillate thereby transmitting a continuous wave signal 28 and is simultaneously capable of receiving and detecting a modulated signal 32 by functioning as a self-oscillating mixer. In doing so the semi-passive transponder tag 30 is able to communicate with the interrogator circuit 2 even though it does not include its own active transmitter circuit.

When it is required for the interrogator circuit 34 to talk to the tag 30 the signal 28 can be modulated by modulating the drain-source current $I_{ds}$ of the FET 8. Modulation of the drain-source current modulates the reflection gain of the FET 8 which in turn modulates the magnitude of the signal 28. It will be appreciated however that other methods of modulating the signal may be used within the scope of the preset invention.

It is found that a high conversion gain efficiency is obtained when the reflection coefficient of the antenna 4 is low. This is achieved by arranging the circuit such that the frequency of oscillation is determined by the resonant frequency of the antennae. The frequency of self oscillation of the circuit is primarily determined by the point at which the net phase shift between the FET 8 and the antenna 4 is zero degrees and where the reflection gain of the FET 8 exceeds the return loss of the antenna 4. The frequency of operation of the circuit is thus determined by (more particularly controlled by) the resonant frequency of the antenna 8. By operating the circuit in this way eliminates the need for any form of frequency stabilization which would require high Q devices, such as a dielectric resonator, thereby simplifying the circuit greatly. Furthermore by operating the circuit such that its frequency of operation is controlled the resonant frequency of the antenna this ensures the FET 8 reflection gain remains high when it is in its stable oscillatory state since the return loss of the antenna is low at its resonant frequency. As the FET reflection gain remains high this ensures that the magnitude of the detected signal appearing at the output 40 is high.

In a preferred embodiment of the invention a fine tuning circuit 42 is provided to enable the frequency of operation to be accurately set. In the circuit shown in FIG. 1 the fine tuning circuit 42 comprises; a resistor 44, a capacitor 46, a diode 48 and the patch antenna 4 includes an additional element 50. The capacitor 46 and diode 48 are connected in series between the element 50 and a point at ground potential. The resistor 42 is connected between a point at a bias voltage, $v_{bins}$ and the point of connection of the capacitor 46 and diode 48. In operation, adjusting the bias voltage will change the capacitance of the diode 48 which will affect the proportion of the radio frequency signal flowing to ground. This will change the effective length of the antenna which determines the resonant frequency of the antenna and hence the frequency of operation of the circuit.

For the embodiment illustrated effect communication with a tag 30 over a number of metres, ten metres, is possible. The power consumption of the circuit is very low as typically the current consumption is of the order of a couple of milliamperes, and this enables the interrogator 2 to be operated from a battery supply for a long operating life. In contrast, known interrogator circuits consume a few hundred milliamperes. A further advantage of the invention is the reduced circuitry and associated costs. For example, for the embodiment illustrated the physical dimension of circuit are about a twentieth of those of known interrogator circuits with a similar performance. Such a reduction in size is important in many applications, for example cordless telephones.

It will be appreciated that modification to the circuit illustrated may be made within the scope of the invention. For example whilst a FET 8 is shown other forms of transistors may be used for example a bipolar transistor depending on the required frequency of operation. Likewise the precise details of the networks 6, 12, 14 can be tailored to suit the required frequency of operation. Furthermore the demodulated output 40 could be derived from the current flow at the drain d of FET 8 or other forms of detection may be used.

What I claim is:

1. A radio interrogator circuit for use with a transponder of a type which reflectively modulates a received radio signal, the interrogator circuit comprising:

a transistor;

an antenna connected to an input of the transistor; and means for operating the transistor as a reflection amplifier such that it self oscillates and radiates a radio signal from the antenna and simultaneously operates as a mixer to produce an output which is representative of the modulation of a radio signal received by the antenna which has been reflectively modulated by the transponder and wherein the frequency of oscillation of the transistor is determined by the resonant frequency of the antenna.

2. An interrogator circuit according to claim 1 and further comprising means for setting the resonant frequency of the antenna.

3. An interrogator circuit according to claim 2, which the means for setting, sets the resonant frequency of the antenna by changing the effective length of the antenna.

4. An interrogator according to claim 3 in which the circuit is operated at microwave frequencies and in the which the antennae comprises a patch antenna.

5. An interrogator circuit according to claim 4 in which the means for setting the resonant frequency of the antenna comprises a further antenna element and means for setting what proportion of the signal received the antenna passes through the further antenna element to ground.

6. An interrogator circuit according to claim 1 in which the transistor is a field effect transistor.

7. An interrogator circuit according to claim 1 and further comprising means for modulating the signal radiated from the antenna.

8. An interrogator circuit according to claim 7 in which the transistor is a field effect transistor and in the which the input of the field effect transistor comprises the gate and wherein the means for modulating the signal radiated from the antenna is operable to modulate the drain/source current of the transistor.

9. An interrogator circuit according to claim 1 and further comprising a tuned circuit connected to an output of the transistor to detect modulation of the signal received by the antenna which has been reflectively modulated by the transponder.

10. An interrogator circuit according to claim 1 and further comprising a matching network connecting the antenna to the input of the transistor.

11. An interrogator circuit according to claim 10, in which the matching network is configured such that the return loss of the antenna as seen from the transistor is low.

12. An interrogator circuit according to claim 11 in which the matching network comprises a micro strip line.

13. An interrogator circuit according to claim 1 in which the transistor is a bipolar transistor.

\* \* \* \* \*